(12) United States Patent
Kwon et al.

(10) Patent No.: US 10,283,673 B2
(45) Date of Patent: May 7, 2019

(54) LIGHT EMITTING DEVICE, LIGHT EMITTING DEVICE PACKAGE AND ILLUMINATION SYSTEM

(71) Applicants: Oh Min Kwon, Seoul (KR); Jong Pil Jeong, Seoul (KR)

(72) Inventors: Oh Min Kwon, Seoul (KR); Jong Pil Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/316,326

(22) Filed: Jun. 26, 2014

(65) Prior Publication Data

US 2014/0306178 A1     Oct. 16, 2014

Related U.S. Application Data

(63) Continuation of application No. 12/977,841, filed on Dec. 23, 2010, now Pat. No. 8,796,705.

(30) Foreign Application Priority Data

Dec. 28, 2009   (KR) .................. 10-2009-0132182

(51) Int. Cl.
*H01L 33/24*     (2010.01)
*H01L 33/22*     (2010.01)
*H01L 33/06*     (2010.01)

(52) U.S. Cl.
CPC .............. *H01L 33/24* (2013.01); *H01L 33/06* (2013.01); *H01L 33/22* (2013.01); *H01L 2224/48091* (2013.01); *H01L 2924/12032* (2013.01)

(58) Field of Classification Search
CPC ...................................... H01L 33/24

USPC .......................................................... 257/97
See application file for complete search history.

(56) References Cited

U.S. PATENT DOCUMENTS

| 2004/0026710 | A1 | 2/2004 | Tsuda et al. |
| 2005/0056850 | A1 | 3/2005 | Taki |
| 2006/0246612 | A1* | 11/2006 | Emerson ............... H01L 33/24 438/22 |
| 2007/0120141 | A1 | 5/2007 | Moustakas et al. |

(Continued)

FOREIGN PATENT DOCUMENTS

| JP | 9-331116 | 12/1997 |
| KR | 10-2006-0027133 | 3/2006 |

(Continued)

OTHER PUBLICATIONS

Machine translation of Shin et al., KR 10-0699147, Mar. 21, 2007.*

(Continued)

*Primary Examiner* — Hsin Yi Hsieh
(74) *Attorney, Agent, or Firm* — KED & Associates, LLP (57) ABSTRACT

A light emitting device is provided. The light emitting device includes a first semiconductor layer, an active layer including a plurality of well layers and a plurality of barrier layers on the first semiconductor layer, a second semiconductor layer on the active layer, and an electrode layer on the second semiconductor layer. A top surface of a first barrier layer adjacent to the second semiconductor layer includes an uneven surface and has a larger area than an area of a top surface of a second barrier layer, wherein the first barrier layer has a thickness thicker than a thickness of the second barrier layer.

10 Claims, 6 Drawing Sheets

(56) References Cited

U.S. PATENT DOCUMENTS

| | | |
|---|---|---|
| 2008/0315178 A1 | 12/2008 | Kim |
| 2009/0008624 A1 | 1/2009 | Tsai et al. |
| 2009/0014713 A1 | 1/2009 | Kang et al. |
| 2009/0121214 A1 | 5/2009 | Tu et al. |
| 2010/0155704 A1 | 6/2010 | Oh et al. |
| 2010/0308357 A1 | 12/2010 | Horie et al. |

FOREIGN PATENT DOCUMENTS

| | | |
|---|---|---|
| KR | 10-0699147 | 3/2007 |
| KR | 10-2009-0002165 A | 1/2009 |
| KR | 10-2009-0002195 | 1/2009 |
| KR | 10-2009-0018458 | 2/2009 |
| WO | WO 2005/086243 | 9/2005 |

OTHER PUBLICATIONS

Korean Office Action issued in KR Application No. 10-2009-0132182 dated Dec. 8, 2010.
Korean Decision to Grant a Patent dated Feb. 28, 2011 issued in Application No. 10-2009-0132182.
Extended European Search Report for Application 10192964.4 dated Dec. 20, 2013.
U.S. Office Action for parent U.S. Appl. No. 12/977,841 dated Jul. 20, 2012.
U.S. Office Action for parent U.S. Appl. No. 12/977,841 dated Feb. 27, 2013.

\* cited by examiner

LIGHT EMITTING DEVICE, LIGHT EMITTING DEVICE PACKAGE AND ILLUMINATION SYSTEM

CROSS-REFERENCE TO RELATED APPLICATIONS

The present application is a continuation of application Ser. No. 12/977,841, filed on Dec. 23, 2010, which claims priority under 35 U.S.C. 119(a) to Korean Patent Application No. 10-2009-0132182 (filed on Dec. 28, 2009), which is hereby incorporated by reference in its entirety.

BACKGROUND

The present disclosure relates to a light emitting device, light emitting device package, and an illumination system.

Group III-V nitride semiconductors have been widely used as the core materials of light emitting devices such as Light Emitting Diodes (LED) and Laser Diodes (LD), in physical and chemical characteristics. The group III-V nitride semiconductors consist of semiconductor materials having the composition equation of $In_xAl_yGa_{1-x-y}N$ (where $0 \leq x \leq 1$, $0 \leq y \leq 1$, and $0 \leq x+y \leq 1$).

The LED is a sort of semiconductor device that changes electricity into infrared rays or light by using the characteristics of compound semiconductors to input/output a signal, or is used as a light source.

The LED or the LD with nitride semiconductor materials is much applied to the light emitting devices for obtaining light. For example, the LED or the LD is applied as the light sources of all sorts of products such as the light emitting portions of the key pads of cellular phones, electronic display boards and lighting devices.

SUMMARY

Embodiments provide a light emitting device of high efficiency.

Embodiments provide a light emitting device whose interface between an active layer and a second conductive type semiconductor layer has an uneven surface.

Embodiments provide a light emitting device whose uppermost barrier layer of an active layer has a larger area than that of other barrier layers.

Embodiments provide a light emitting device package and an illumination system having a light emitting device whose internal quantum efficiency is improved.

In one embodiment, a light emitting device comprises a first conductive type semiconductor layer; an active layer including a plurality of well layers and a plurality of barrier layers on the first conductive type semiconductor layer; and a second conductive type semiconductor layer on the active layer, wherein an upper surface of at least first barrier layer between the barrier layers includes an uneven surface, and the first barrier layer is disposed more closely to the second conductive type semiconductor layer than to the first conductive type semiconductor layer.

In another embodiment, a light emitting device comprises a first conductive type semiconductor layer; an active layer including a well layer and a barrier layer on the first conductive type semiconductor layer; and a second conductive type semiconductor layer on the active layer, wherein an area of a contact interface between the active layer and the first conductive type semiconductor layer is smaller than that of a contact interface between the active layer and the second conductive type semiconductor layer.

DETAILED DESCRIPTION OF THE EMBODIMENTS

In the descriptions of embodiments, it will be understood that when a layer (or film), a region, a pattern, or a structure is referred to as being 'on' substrate, each layer (or film), a region, a pad, or patterns, it can be directly on substrate each layer (or film), the region, the pad, or the patterns, or intervening layers may also be present. Further, it will be understood that when a layer is referred to as being 'under' each layer (film), the region, the pattern, or the structure, it can be directly under another layer (film), another region, another pad, or another patterns, or one or more intervening layers may also be present.

A dimension of each of elements may be exaggerated for clarity of illustration, and the dimension of each of the elements may be different from an actual dimension of each of the elements.

Hereinafter, embodiments will be described with reference to the accompanying drawings.

Figure 1:
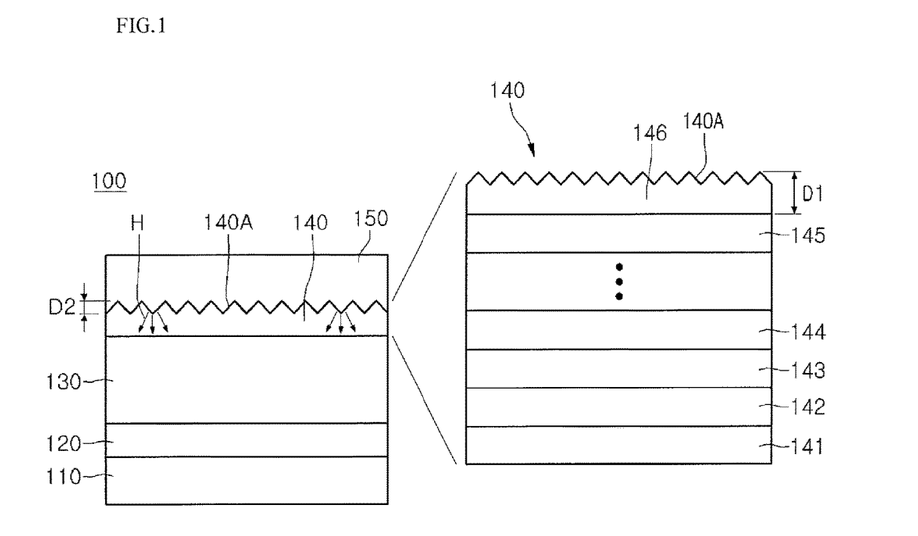
FIG. 1 is a side-sectional view illustrating a light emitting device according to a first embodiment.

FIG. 1 is a side-sectional view illustrating a light emitting device according to a first embodiment.

Referring to FIG. 1, a light emitting device 100 includes a substrate 110, a buffer layer 120, a first conductive type semiconductor layer 130, an active layer 140, and a second conductive type semiconductor layer 150.

An insulating substrate or conductive substrate may be used for the substrate 110. For instance, at least one of sapphire ($Al_2O_3$), SiC, Si, GaAs, GaN, ZnO, Si, GaP, InP, and Ge may be used. On an upper surface of the substrate 110, an uneven pattern or roughness may be formed. Herein, the uneven pattern may be formed as one body with the substrate 100 or may be separately formed. The uneven pattern may improve light extraction efficiency by changing a critical angle of incident light.

A compound semiconductor layer may be formed on the substrate 110. The compound semiconductor layer may be grown by equipment such as electron beam evaporator, Physical Vapor Deposition (PVD), Chemical Vapor Deposition (CVD), Plasma Laser Deposition (PLD), dual-type thermal evaporator sputtering, Metal Organic Chemical Vapor Deposition (MOCVD) and the like, and the equipment is not limited to the listed equipment. The compound semiconductor layer may be formed as a layer or pattern using group II to VI compound semiconductor, and may be formed as multi-layers.

The buffer layer 120 is formed on the substrate 110. The buffer layer 120 may be formed as a layer or pattern using group II to VI compound semiconductor. The buffer layer 120 may include a composition equation of, e.g., $In_xAl_yGa_{1-x-y}N$ ($0 \leq x \leq 1$, $0 \leq y \leq 1$, $0 \leq x+y \leq 1$) of, e.g., a semiconductor layer using group III-V compound semiconductor.

The buffer layer 120 may include at least one selected from a group of GaN, AlGaN, InGaN, InN, InAlGaN, AlInN, AlGaAs, GaP, GaAs, GaAsP, and AlGaInP. The buffer layer 120 may be formed with oxide such as a ZnO layer and is not limited to this. The buffer layer 120 may not be formed, and it is not limited whether to form the buffer layer.

An undoped semiconductor layer may be formed on the substrate 110 or the buffer layer 120. The undoped semiconductor layer may be embodied with GaN-based semiconductor using group III-V compound semiconductor. Such undoped semiconductor layer may include n-type dopant even if the undoped semiconductor layer is not doped with conductive dopant intentionally. The undoped semiconductor layer may be formed with a lower dopant concentration than that of the first conductive type semiconductor layer 130, and may be formed as a low conductive layer or a high resistant layer in comparison with the first conductive type semiconductor layer 130; however, the undoped semiconductor layer is not limited to this.

The first conductive type semiconductor layer 130 may be formed on the substrate 110 or the buffer layer 120. The first conductive type semiconductor layer 130 may be formed with the composition equation of, e.g., $In_xAl_yGa_{1-x-y}N$ ($0 \leq x \leq 1$, $0 \leq y \leq 1$, $0 \leq x+y \leq 1$) of group III-V compound semiconductor doped with a first conductive dopant. The first conductive type semiconductor layer 130 may include at least one selected from the group of GaN, AlGaN, InGaN, InN, InAlGaN, AlInN, AlGaAs, GaP, GaAs, GaAsP, and AlGaInP. In the case that the first conductive type semiconductor layer 130 is an N-type semiconductor layer, the first conductive dopant includes Si, Ge, Sn, Se, and Te as the N-type dopant.

A first conductive type clad layer may be formed between the first conductive type semiconductor layer 130 and the active layer 140. The first conductive type clad layer may be formed with the GaN-based semiconductor and has a larger band gap than that of a barrier layer within the active layer 140. The first conductive type clad layer serves to restrain a carrier.

The active layer 140 is formed on the first conductive type semiconductor layer 130. The active layer 140 may be formed as at least one structure among structures of single quantum well, Multiple Quantum Well (MQW), quantum wire, and quantum dot. A well layer and a barrier layer may be formed for the active layer 140 using material of group III-V compound semiconductor. Hereinafter, for convenience of explanation, it is assumed that the active layer 140 has the multiple quantum well structure where well layers 141, 143, and 145 and barrier layers 142, 144, and 146 are alternately disposed.

A pair of well layer/barrier layer of the active layer 140 may be such that InGaN well layer/GaN barrier layer, GaN well layer/AlGaN barrier layer, InGaN well layer/AlGaN barrier layer, and InGaN well layer/InGaN barrier layer. The active layer 140 may be formed with a period of 2 to 30, and at least one of the barrier layers 142, 144, and 146 may be doped with dopant such as indium or silicon or may be undoped; however, they are not limited to this. The band gap of the well layers 142, 144, and 146 may be formed as higher than that of the well layers 141, 143, and 145.

The well layer 141 may be disposed as an undermost layer of the active layer 140, and the barrier layer 146 may be disposed as an uppermost layer. Instead of the well layer 141, the barrier layer may be disposed as the undermost layer.

In the embodiment, an upper surface of at least one of the barrier layers 142, 144, and 146 of the active layer 140 may be formed as an uneven surface, and the at least one barrier layer may be closer to the second conductive type semiconductor layer 150 than to the first conductive type semiconductor layer 130. The barrier layer 146 disposed as the uppermost layer of the active layer 140 may be formed as the uneven surface, and the uppermost barrier layer 146 is referred to as a first barrier layer below.

The first barrier layer 146 may be formed with the composition equation of $In_xAl_yGa_{1-x-y}N$ ($0 \leq x \leq 1$, $0 \leq y \leq 1$, $0 \leq x+y \leq 1$) and may be formed with material having a band gap higher than that of the well layers 141, 143, and 145.

An upper surface of the first barrier layer 146 is formed as an uneven surface 140A. The uneven surface 140A is not flat, has concave-convex structure, and is rough, and it may be formed as a three-dimensional shape. The upper surface of the first barrier layer 146 may not have a flat section.

Since the upper surface of the first barrier layer 146 of the active layer 140 is formed as the uneven surface 140A, an area of the upper surface of the first barrier layer 146 is larger than that of each upper surface of the other barrier layers 142 and 144. Accordingly, a hole injection area for the first barrier layer 45 may be increased so that hole injection efficiency may be improved.

The active layer 140 may be grown and formed by using nitrogen or/and hydrogen as a carrier gas at a growth temperature ranging from about 780° C. to about 1000° C. and supplying ambient gas $NH_3$, gallium precursor TMGa (TEGa), TMIn, and TMAl. Each of the well layers 141, 143, and 145 of the active layer 140 may be formed to a thickness ranging from about 10 Å to about 30 Å, and each of the barrier layers 142 and 144 may be formed to a thicker thickness, e.g., from about 40 Å to about 200 Å.

The growth condition of the first barrier layer 146 may be different from that of the lower barrier layers 142 and 144 of the active layer 140 in growth temperature or/and ambient gas. For instance, by decreasing the growth temperature of the first barrier layer 146 to be lower than the growth temperature (e.g., about 700 Å to about 1200 Å) of the first conductive type semiconductor layer 130 by 150° C., the uneven surface 140A may be grown. For another example, by decreasing the growth temperature of the first barrier layer 146 to be lower than the growth temperature of the other barrier layers 142 and 144 by 150° C., the uneven surface 140A may be grown. Since the upper surface of the first barrier layer 146 is grown to the uneven surface, the damage due to wire bonding or the like is dispersed so that loss of the active layer 140 may be prevented.

Herein, a thickness D1 of the first barrier layer 146 may be equal to or thicker than that of the other barrier layers 142 and 144, e.g., ranging from about 40 Å to about 2000 Å. A depth of a concave part D2 of the first barrier layer 146 may range from about 10 Å to about 2000 Å and may be formed to a depth smaller than the thickness of the first barrier layer 146. Also, the thickness D1 of the first barrier layer 146 may be thicker than that of the other barrier layers 142 and 144 by at least about 10 Å. The depth of the concave part D2 may be preferably equal to or larger than about 50 Å, and this depth is a critical numerical value considering resistance. A convex part of the uneven surface 140A may be formed as a circle shape or a cone shape having a polygonal shape, and it is not limited to this.

On the uneven surface 140A of the first barrier layer 146, the concave part or the convex part may be formed at regular intervals or irregular intervals.

Since the upper surface area of the first barrier layer 146 is increased, a contact area at an interface between the first barrier layer 146 and the second conductive type semiconductor layer 150 is increased, and the efficiency of injecting holes to the second barrier layer 146 may be improved. By the upper surface area of the first barrier layer 146, Electron Hole Pair (EHP) density may be increased and light emitting efficiency may be substantially improved.

A cap layer may be formed on the active layer 140, and the uneven surface 140A may be formed on an upper surface of not the first barrier layer 146 but the cap layer. This may form the uneven surface more closely to the active layer 140 than to the upper surface or top surface of the second conductive type semiconductor layer 150.

Figure 2:
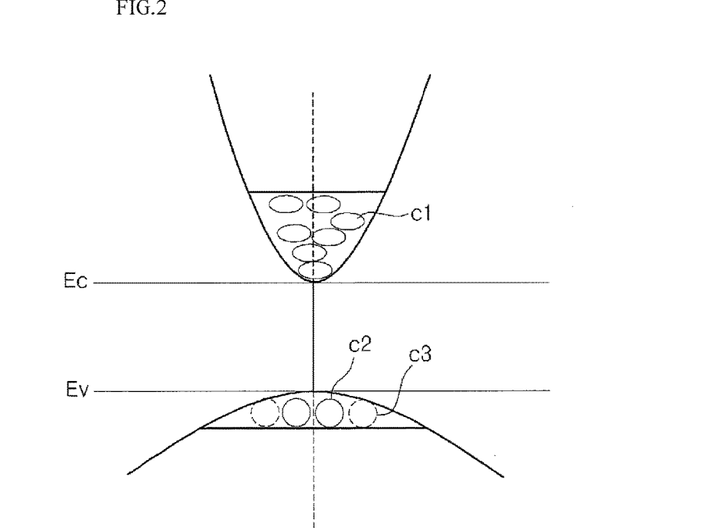
FIG. 2 is a diagram illustrating an energy band structure of an active layer of FIG. 1 according to the embodiment.

FIG. 2 is a diagram illustrating an energy band structure of the active layer according to the embodiment. As illustrated in FIGS. 1 and 2, holes C2 and C3 at a valence band Ev may be more injected through the first barrier layer 146 so that recombination ratio with an electron C1 at a conduction band Ec may be increased and thus the light emitting efficiency may be increased. Herein, there is an effect of supplementing partial holes for the active layer 140 by at least one uneven surface 140A.

Meanwhile, the second conductive type semiconductor layer 150 is formed on the active layer 140, and the second conductive type semiconductor layer 150 may be formed with the composition equation of $In_xAl_yGa_{1-x-y}N$ ($0 \leq x \leq 1$, $0 \leq y \leq 1$, $0 \leq x+y \leq 1$). The second conductive type semiconductor layer 150 may include group III-V compound semiconductor doped with a second conductive dopant, e.g., at least one selected from the group of GaN, AlN, AlGaN, InGaN, InN, InAlGaN, AlInN, AlGaAs, GaP, GaAs, GaAsP, and AlGaInP. In the case that the second conductive type is P-type semiconductor, the second conductive dopant includes P-type dopant such as Mg and Ze. The second conductive type semiconductor layer 150 may be formed as a single layer or multi layers, and it is not limited to this.

Herein, concentration of the dopant of the second conductive type semiconductor layer 150 may range from about $10^{17}$ cm$^{-3}$ to about $10^{22}$ cm$^{-3}$ for the doping. The second conductive type semiconductor layer 150 may be formed to a thickness of more than several hundreds of angstroms, and typically, it may be formed to a thickness ranging from about 1000 Å to about 5000 Å.

Herein, the P-type dopant concentration of the second conductive type semiconductor layer 150 may be about 1% to about 10% of the N-type dopant concentration of the first conductive type semiconductor layer 140 and, e.g., may have dopant concentration of about $10^{17}$ cm$^{-3}$. Even if the P-type dopant concentration of the second conductive type semiconductor layer 150 may be lower than 10% of the N-type dopant concentration of the first conductive type semiconductor layer 140, the hole injection efficiency may be improved by the uneven surface 140A of the active layer 140.

The contact interface between the active layer 140 and the second conductive type semiconductor layer 150 is about 50% larger than that between the active layer 140 and the first conductive type semiconductor layer 130 due to the uneven surface 140A. Accordingly, even if the P-type dopant concentration of the second conductive type semiconductor layer 150 may be lower than the N-type dopant concentration of the first conductive type semiconductor layer 140, the hole injection efficiency and internal quantum efficiency may be improved.

Meanwhile, the first conductive type semiconductor layer 130 and the second conductive type semiconductor layer 150 may be embodied as the P-type semiconductor layer and the N-type semiconductor layer respectively. A third conductive type semiconductor layer having different polarity from the second conductive type semiconductor layer 150 may be formed on the second conductive type semiconductor layer 150. The first conductive type semiconductor layer 130, the active layer 140, and the second conductive type semiconductor layer 150 may be defined as a light emitting structure for the semiconductor light emitting device 100. The light emitting structure may be embodied as one structure among N-P junction, P-N junction, N-P-N junction, and P-N-P junction. For convenience of explanation, it is assumed that the upper most semiconductor layer of the light emitting device 100 is the second conductive type semiconductor layer 150 below.

One of a transparent electrode layer (not illustrated), a reflection electrode layer, and a second electrode may be formed on the second conductive type semiconductor layer 150. The transparent electrode layer may include at least one selected from a group of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, IrOx, RuOx, and NiO on almost whole surface of the second conductive type semiconductor layer 150.

The reflection electrode layer may selectively include metal material or alloy of Al, Ag, Pd, Ph, Pt, and Ir on almost whole surface of the second conductive type semiconductor layer 150.

The second electrode may be formed on the second conductive type semiconductor layer 150 and/or the transparent electrode layer and may include an electrode pad. A current diffusion pattern may be further formed.

Figure 3:
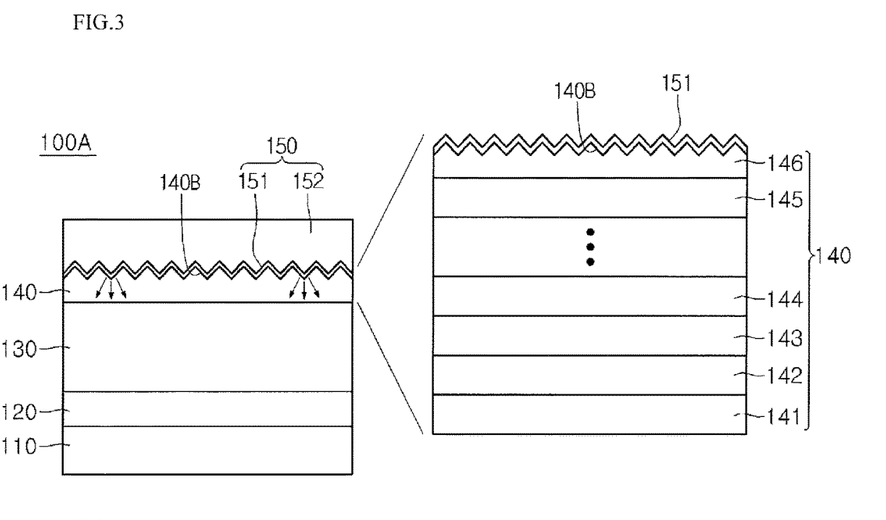
FIG. 3 is a diagram illustrating a light emitting device according to a second embodiment.

FIG. 3 is a diagram illustrating a light emitting device according to a second embodiment. For explaining the second embodiment illustrated in FIG. 3, the same parts in comparison with the first embodiment are described referring to the first embodiment, and overlapped explanations are omitted.

Referring to FIG. 3, a light emitting device 100A includes a substrate 110, a buffer layer 120, a first conductive type semiconductor layer 130, an active layer 140, and a second conductive type semiconductor layer 150.

The second conductive type semiconductor layer 150 includes a first semiconductor layer 151 and a second semiconductor layer 152 and may be formed with a semiconductor doped with a second conductive dopant, e.g., at least one selected from the group of GaN, AlN, AlGaN, InGaN, InN, InAlGaN, AlInN, AlGaAs, GaP, GaAs, GaAsP, and AlGaInP.

The P-type dopant concentration of the first semiconductor layer 151 may be different from that of the second semiconductor layer 152, e.g., the P-type dopant concentration of the first semiconductor layer 151 may be higher than that of the second semiconductor layer 152.

The P-type dopant concentration of the first semiconductor layer 151 may range from about $10^{19}$ cm$^{-3}$ to about $10^{22}$ cm$^{-3}$ for doping. A thickness of the first semiconductor layer 151 may be thinner than that of the second semiconductor layer 152 and, e.g., may be larger than about 50 Å.

Material of the first semiconductor layer 151 may be different from or same as that of the first barrier layer 146, and they may have same or different band gap.

The first barrier layer 146 of the active layer 140 is formed as an uneven surface 140B, and the first semiconductor layer 151 is disposed on the first barrier layer 146. The first semiconductor layer 151 may be formed as an uneven layer along the uneven surface 140B of the first barrier layer 146. The first semiconductor layer 151 is formed as the uneven layer, and its upper surface area may be the same as that of the uneven surface 140B.

The first semiconductor layer 151 may be formed as the uneven surface without the flat section. Since the first semiconductor layer 151 is disposed more closely to the active layer 140 than to the upper surface of the second semiconductor layer 152, the hole injection efficiency may be effectively improved.

The uneven surface 140B of the first barrier layer 146 and the first semiconductor layer 151 are formed to have an area about 50% larger than that of the other barrier layers 142 and 144 so that the efficiency of injecting holes to the active layer 140 may be improved.

Figure 4:
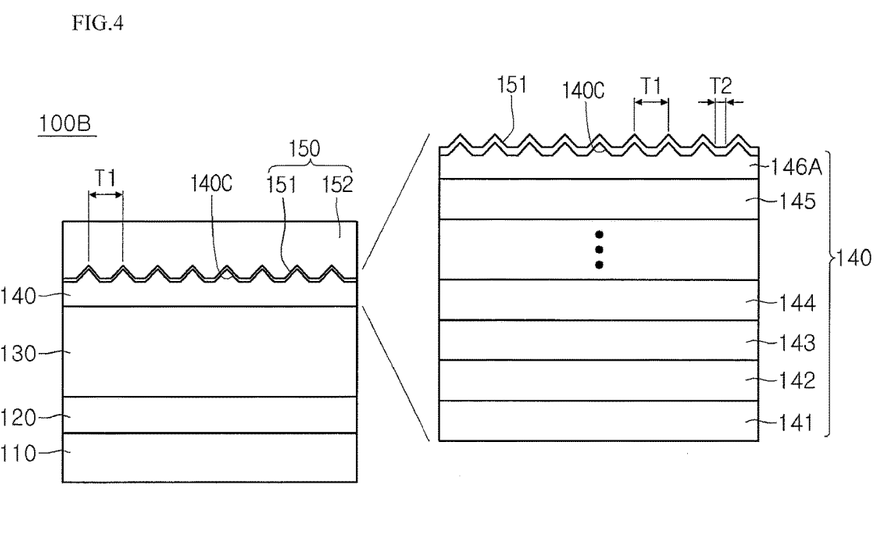
FIG. 4 is a side-sectional view illustrating a light emitting device according to a third embodiment.

FIG. 4 is a side-sectional view illustrating a light emitting device according to a third embodiment. For explaining the third embodiment illustrated in FIG. 4, the same parts in comparison with the second embodiment are described referring to the second embodiment, and overlapped explanations are omitted.

Referring to FIG. 4, in a light emitting device 100B, an upper surface of a first barrier layer 146A of the active layer 140 is formed as an uneven surface 140C, and the concave part of the uneven surface 140C includes a substantially flat section T2.

The flat section T2 of the uneven surface 140C may be formed at the concave part of the uneven surface 140C, the convex part may be formed as the circle shape or the cone shape having the polygonal shape.

A growth condition of the first barrier layer 146A of the active layer 140 is as follows. The growth temperature of the first barrier layer 146A is gradually lowered from the growth temperature of the other barrier layers 142 and 144. Herein, a distance T1 of the convex part at the uneven surface 140C may be separated at regular intervals, and the concave part of the first barrier layer 146A may be formed as the section T2 having the flat plane between the convex part.

The first semiconductor layer 151 of high dopant concentration may be formed on the first barrier layer 146A of the active layer 140 and may be formed along the uneven surface 140C of the first barrier layer 146A. The first semiconductor layer 151 is formed as the uneven layer, and its upper surface area may be the same as that of the uneven surface 140C.

On the first barrier layer 146A, the first semiconductor layer 151 of high dopant concentration may be formed, or as illustrated in FIG. 1, the second conductive type semiconductor layer may be formed.

Figure 5:
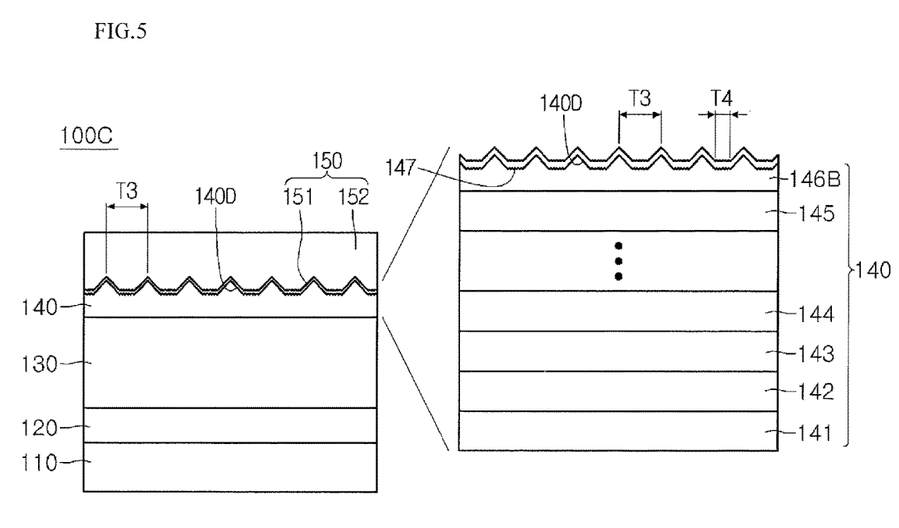
FIG. 5 is a side-sectional view illustrating a light emitting device according to a fourth embodiment.

FIG. 5 is a side-sectional view illustrating a light emitting device according to a fourth embodiment. For explaining the fourth embodiment illustrated in FIG. 5, the same parts in comparison with the second embodiment are described referring to the second embodiment, and overlapped explanations are omitted.

Referring to FIG. 5, in a light emitting device 100C, an upper surface of a first barrier layer 146B of the active layer 140 is formed as an uneven surface 140D, and the uneven surface 140D includes a substantially flat section T4 having a plurality of uneven patterns. As is shown in FIG. 5, a top surface of the barrier layer 144 has a flat surface. The flat surface of the barrier layer 144 is larger than the flat sections T4 of the first barrier layer 146B.

The growth temperature of the first barrier layer 146B is lowered as much as a certain temperature (e.g., below 150° C.) from the growth temperature of the first conductive type semiconductor layer 130, and supply amount of ammonia is reduced. The supply amount of ammonia may be reduced by about 50% in comparison with that of the other barrier layers 142 and 144 of the active layer 140. On the surface of the uneven surface 140D of the first barrier layer 146B, a distance T3 of the convex part may be formed at irregular intervals and sizes, and a plurality of uneven patterns 147 having a lower height than a peak height of the uneven surface 140D may be formed.

The first semiconductor layer 151 of high dopant concentration disposed on the first barrier layer 146B may be formed as an uneven layer, and a substantially flat section T4 having a micro uneven pattern may be formed by the micro uneven pattern 147 of the uneven surface 140D. The contact area between the active layer 140 and the first semiconductor layer 151 may be increased due to the uneven surface 140D having the micro uneven pattern 147, and this contact area may improve the hole injection efficiency.

On the first barrier layer 146B, the second conductive type semiconductor layer instead of the first semiconductor layer 151 may be formed as illustrated in FIG. 1

Figure 6:
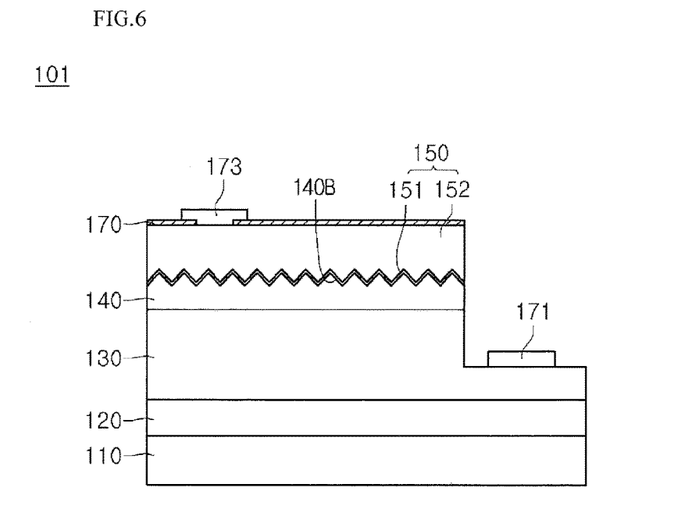
FIG. 6 is a side-sectional view illustrating a light emitting device having a lateral electrode structure and using the embodiment illustrated in FIG. 3.

FIG. 6 is a diagram illustrating a light emitting device having a lateral electrode structure and using the embodiment illustrated in FIG. 3. For explaining the light emitting device illustrated in FIG. 6, the same parts in comparison with FIG. 3 will be described referring to FIG. 3.

Referring to FIG. 6, in a light emitting device 101A, a first electrode 171 may be formed on the first conductive type semiconductor layer 130, and a second electrode 173 may be formed on the second conductive type semiconductor layer 150. A current spreading layer 170 or/and an insulating layer may be formed on the second conductive type semiconductor layer 150. The current spreading layer 170 includes a transparent electrode layer or/and a reflection electrode layer. The current spreading layer 170 may be connected to the second electrode 173. The second electrode 173 may contact on the current spreading layer 170 and the second conductive type semiconductor layer 150.

The transparent electrode layer may be formed with indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), metal oxide, or metal nitride. The second electrode 173 may be formed with one or combination from Ag, Ag alloy, Ni, Al, Al alloy, Rh, Pd, Ir, Ru, Mg, Zn, Pt, Au, and Hf. The second electrode 173 may include an electrode pad, or a separate electrode pad may be formed.

Since the contact interface between the active layer 140 and the second conductive type semiconductor layer 150 is more increased than that between the active layer 140 and the first conductive type semiconductor layer 130, the efficiency of injecting holes to the active layer 140 may be improved and the light emitting efficiency may also be improved.

Figure 7:
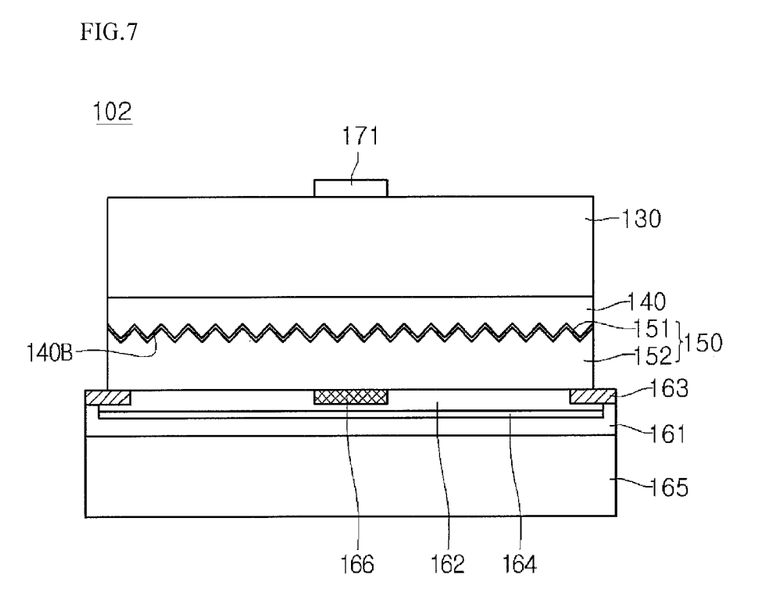
FIG. 7 is side-sectional view illustrating a light emitting device having a vertical electrode structure and using the embodiment illustrated in FIG. 3.

FIG. 7 is side-sectional view illustrating a light emitting device 102 having a vertical electrode structure and using the embodiment illustrated in FIG. 3.

Referring to FIG. 7, the active layer 140 is disposed between the first conductive type semiconductor layer 130 and the second conductive type semiconductor layer 150. The first conductive type semiconductor layer 130 is embodied as the N-type semiconductor layer and may be connected to the first electrode 171. The second conductive type semiconductor layer 150 may be embodied as the P-type semiconductor layer and may be supplied with power through a region larger than about 50% of its lower surface area. The contact interface between the active layer 140 and the second conductive type semiconductor layer 150 may be more increased than that between the active layer 140 and the first conductive type semiconductor layer 130 due to the uneven surface 140B.

The N-type semiconductor layer may be further formed under the second conductive type semiconductor layer 150; however, it is omitted for convenience of explanation below.

Under the second conductive type semiconductor layer 150, a protection layer 163, a current blocking layer 166, a first conductive layer 162, a second conductive layer 164, a third conductive layer 161, and a support member 165 may be included. Herein, the substrate illustrated in FIG. 3 may be removed after depositing or attaching the support member 165. The removing process may include a physical method or/and a chemical method. The physical method may include Laser Lift Off (LLO), and the chemical method may include wet etching liquid. The buffer layer 120 illustrated in FIG. 3 may be eliminated by selectively using etching or/and polishing.

At least one of the second conductive layer 164, the third conductive layer 161, and the support member 165 is functioned as a second electrode, and the first electrode 171 may be formed on the first conductive type semiconductor layer 130. The first electrode 171 and the second electrode may be oppositely disposed, and they are not limited to this.

The upper surface of the first conductive type semiconductor layer 130 may be formed as a light extraction structure, e.g., the concave-convex structure or roughness. The light extraction structure of the first conductive type semiconductor layer 130 may improve external quantum efficiency by changing the critical angle of incident light.

The support member 164 includes a conductive support member using sheet form or plating method and may be formed to a thickness of more than several tens of micro meters. The conductive support member may include at least one of, e.g., copper (Cu), gold (Au), nickel (Ni), molybdenum (Mo), copper-tungsten (Cu—W), and carrier wafer (e.g., Si, Ge, GaAs, ZnO, and SiC). The support member 165 may include an insulating support member, and it is not limited to this.

The third conductive layer 161 may be formed on the support member 165. The third conductive layer 161 is a bonding layer and is joined between the second conductive layer 164 and the support member 165.

The third conductive layer 161 may include barrier metal or bonding metal, e.g., may include at least one selected from Ti, Au, Sn, Ni, Cr, Ga, In, Bi, Cu, Ag, Ta, and alloy of two or more from those metals.

The third conductive layer 161 may be extended to under the protection layer 163, and it is not limited to this. Also, the third conductive layer 161 may not be formed, and the support member 165 may be disposed under the second conductive layer 164.

The second conductive layer 164 may include metal having reflection ratio of more than about 50% and may be functioned as a reflection layer capable of efficiently reflecting incident light.

The second conductive layer 164 may be formed with metal or alloy including at least one of, e.g., Ag, Ni, Al, Rh, Pd, Ir, Ru, Mg, Zn, Pt, Au, and Hf and may include a single layer or multi layers. Also, the second conductive layer 164 may be formed as multi layers using the metal or alloy and translucent conductive material such as IZO, IZTO, IAZO, IGZO, IGTO, AZO, and ATO and, e.g., may be layered as IZO/Ni, AZO/Ag, IZO/Ag/Ni, and AZO/Ag/Ni.

The first conductive layer 162 may be formed on the second conductive layer 164. The first conductive layer 162 may be ohmic-contacted to the second conductive type semiconductor layer 150 and may be formed as a single layer or multi layers using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au, and Ni/$IrO_x$/Au/ITO. The second conductive layer 164 may be ohmic-contacted to the second conductive type semiconductor layer 150.

The Current Blocking Layer (CBL) 166 may be formed between the first conductive layer 162 and the second conductive type semiconductor layer 150. The upper surface of the current blocking layer 166 may be contacted to the second conductive type semiconductor layer 150, and the lower and side surfaces of the current blocking layer 166 may be contacted to the ohmic contact layer 162.

At least a part of the current blocking layer 166 may be overlapped with the first electrode 171 in a vertical direction, and the current blocking layer 166 may more separate a current path between the first electrode 171 and the support member 165. A width of the current blocking layer 166 is about 0.9 to 1.3 times larger than that of the first electrode 171. For instance, the width of the current blocking layer 166 may be about 1.1 to 1.3 times larger than that of the first electrode 171.

The current blocking layer 166 may be formed using material whose electric conductivity is lower than that of the second conductive layer 164 or first conductive layer 162, material which forms Schottky contact with the second conductive type semiconductor layer 150, or insulating material. For instance, the current blocking layer 166 may include at least one of ITO, ZnO, $SiO_2$, SiON, $Si_3N_4$, $Al_2O_3$, $TiO_2$, Ti, Al, and Cr.

An inner side part of the protection layer 163 is disposed at an outer side under the second conductive type semiconductor layer 150, and its outer side part may be more extended outward than the side of the second conductive type semiconductor layer 150. The protection layer 163 may have a loop shape and may be disposed at the outer side under the second conductive type semiconductor layer 160. The loop shape may be continuous or discontinuous loop shape and may include shapes of circle, polygon, and mixture of curved surface and polygon.

The inner side part of the protection layer 163 may be contacted to the side of the first conductive layer 162. The protection layer 163 may be formed with material whose electric conductivity is lower than that of the second conductive layer 164 or third conductive layer 161, material which forms Schottky contact with the second conductive type semiconductor layer 150, or electric insulating material. For instance, the protection layer 163 may be formed with ZnO, $SiO_2$, SiON, $Si_3N_4$, $Al_2O_3$, and $TiO_2$.

The protection layer 163 may also be formed selectively using indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

The protection layer 163 separates a distance between the third conductive layer 161 and the second conductive layer 150 so that electric short at the side wall of the device may be prevented. The protection layer 163 may also improve adhesive strength between the second conductive type semiconductor layer 150 and the third conductive layer 161.

The side wall of the semiconductor layers 130, 140, and 150 may be slantly formed during an isolation etching process for dividing as a unit chip, and the protection layer 163 may be exposed under the side wall of the semiconductor layers 130, 140, and 150. On the side of the semiconductor layers 130, 140, and 150, an insulating layer may be further formed. The insulating layer is formed with $SiO_2$, SiON, $Si_3N_4$, $Al_2O_3$, and the like and protects the side of the semiconductor layers 130, 140, and 150.

Features of the above-disclosed embodiments are not limited to the embodiments but may be selectively applied to other embodiments. Other modifications and applications are possible through selective combination within the technical scope of the embodiments.

Figure 8:
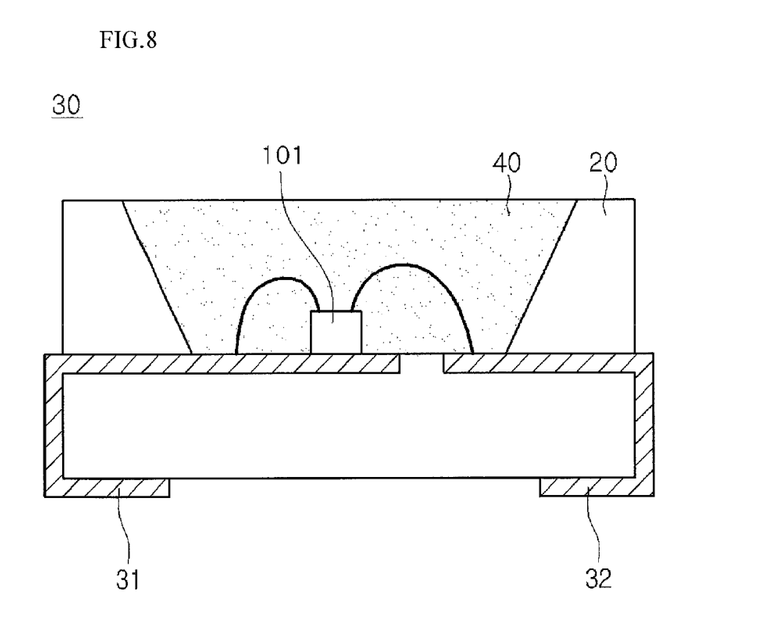
FIG. 8 is a cross-sectional view illustrating a light emitting device package according to an embodiment.

FIG. 8 is a cross-sectional view illustrating a light emitting device package according to an embodiment.

Referring to FIG. 8, a light emitting device package 30 includes a body 20, a first lead electrode 31 and a second lead electrode 32 disposed at the body 20, a light emitting device 101 according to the embodiment, and a molding member 40 covering the light emitting device 101. Herein, the light emitting device is disposed at the body 20 and electrically connected to the first lead electrode 31 and the second lead electrode 32.

The body 20 may be formed including the conductive substrate such as silicon, synthetic resins such as PPA (Polyphthalamide), ceramic substrate, insulating substrate, or metal substrate (e.g., MCPCB). The body 20 includes a concave part such as a cavity whose upper part is open. At the concave part, the light emitting device 101 is disposed, and the first and second lead electrodes 31 and 32 are exposed. A sloping surface may be formed on the circumference of the concave part. The body 20 may include a through-hole structure, and it is not limited to this.

The first lead electrode 31 and the second lead electrode 32 are electrically separated from each other and supply power to the light emitting device 101. The first lead electrode 31 and the second lead electrode 32 may also increase light efficiency by reflecting light generated from the light emitting device 101 and may serve to emit heat generated from the light emitting device 101.

The light emitting device 101 may be installed on the body 20, or on the first lead electrode 31 or the second lead electrode 32.

The light emitting device 101 may be connected to the first lead electrode 31 and the second lead electrode 32 through a wire.

The molding member 40 may surround the light emitting device 101 to protect the light emitting device 101. Also, a fluorescent substance may be included in the molding member 40 so that wavelength of light emitted from the light emitting device 101 may be varied. A lens may be disposed on the molding member 40, and the lens may be embodied as a form to be contacted or not to be contacted to the molding member 40.

The light emitting device 101 may be electrically connected to a lower surface of the body or substrate through the through-hole.

On the light emitting device package 30, at least one of the light emitting devices of the above-described embodiments may be installed, and there is no limit for this.

Although the light emitting device package has been described as a top view form, it may also be embodied as a side view method so that the above-described heat radiating characteristics, conductivity and reflection characteristics may be improved. The light emitting device according to the top view or side view method may be packaged by the resin layer as above-described, and then, the lens may be formed or attached on the resin layer; there is no limit for this.

[Illumination System]

The light emitting device or light emitting device package according to the embodiments may be applied to an illumination system. The illumination system may include a structure of an array of a plurality of light emitting devices or light emitting device packages. The illumination system may include display devices illustrated in FIGS. 9 and 10, an illumination device illustrated in FIG. 11, illumination lamps, signal lights, car headlights, electronic displays, and the like.

Figure 9:
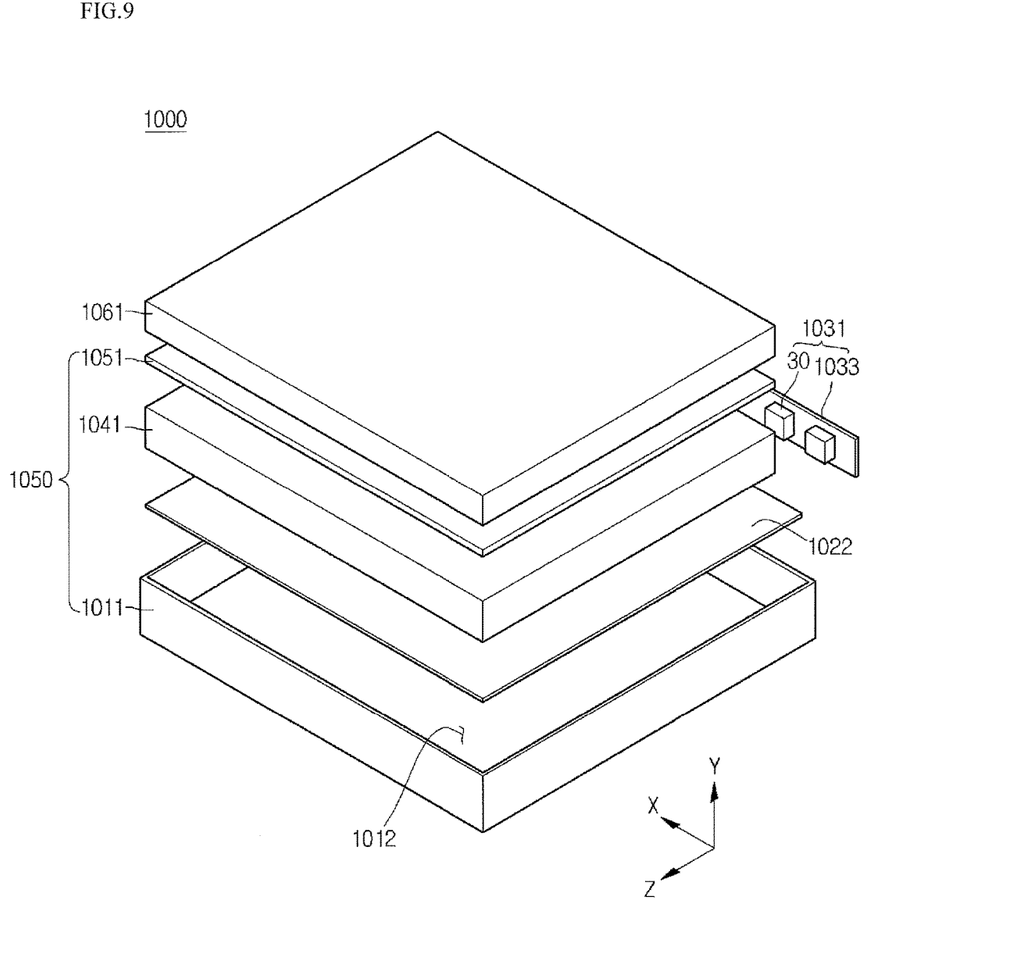
FIG. 9 is a diagram illustrating a display device according to an embodiment.

FIG. 9 is an exploded perspective view illustrating a display device according to an embodiment.

Referring to FIG. 9, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metacrylate (PMMA), polyethylene terephthalate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

Figure 10:
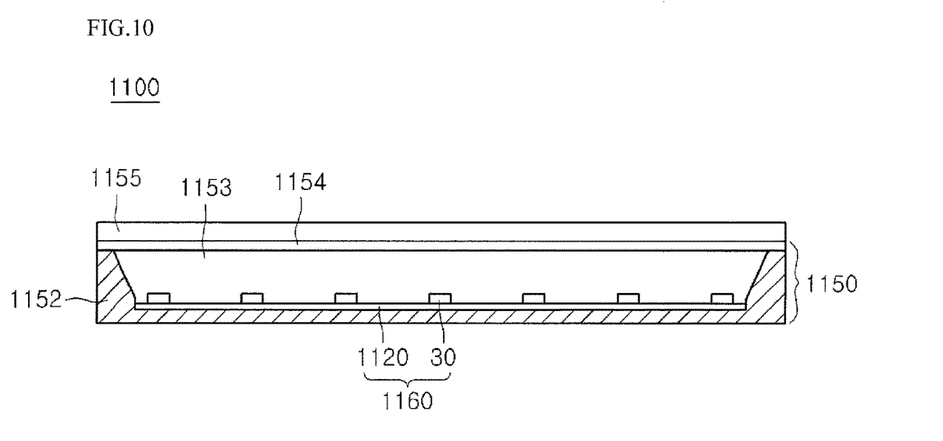
FIG. 10 is a diagram illustrating another display device according to an embodiment.

FIG. 10 is a diagram illustrating a display device according to an embodiment.

Referring to FIG. 10, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1160. The bottom cover 1152, at least one light emitting module 1160, and the optical member 1154 may be defined as a light unit 1150.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1160. The optical member 1154 converts the light emitted from the light emitting module 1160 to the surface light source, or performs diffusing and concentrating light.

Figure 11:
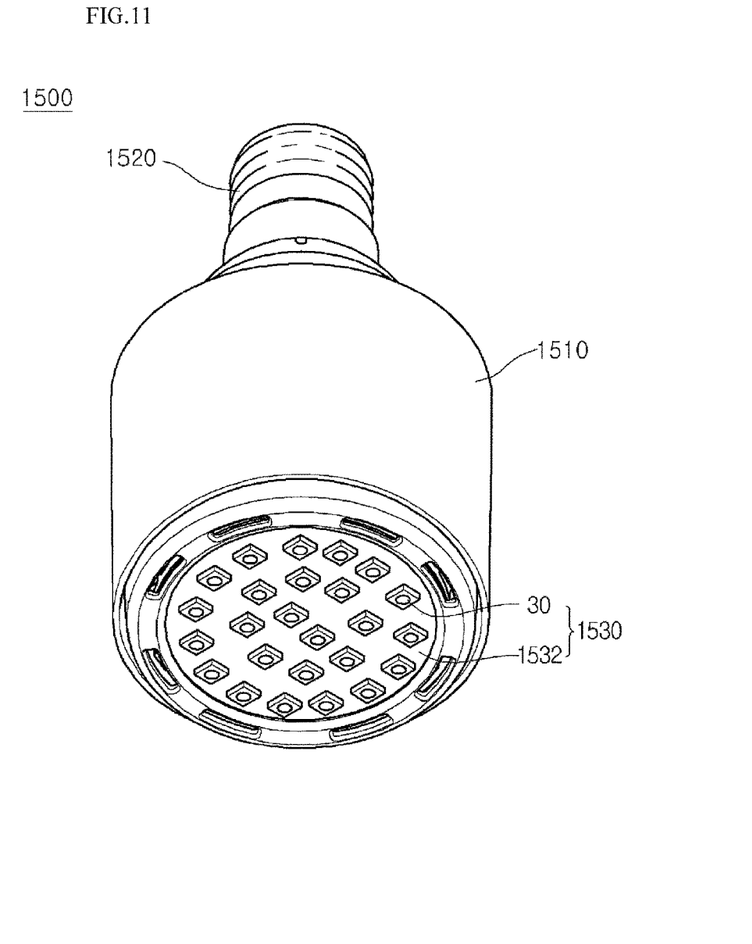
FIG. 11 is a diagram illustrating an illumination device according to an embodiment.

FIG. 11 is a perspective view illustrating an illumination device according to an embodiment.

Referring to FIG. 11, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

According to the embodiment, the package where the light emitting device 100 is packaged may be arranged on the substrate to be embodied as the light emitting module as above, or the light emitting device illustrated in FIG. 1 may be arranged on the substrate and packaged to be embodied as the light emitting module.

According to the embodiment, the efficiency of injecting carriers to the active layer can be increased, and the internal quantum efficiency of the active layer can be improved. Accordingly, reliability of the light emitting device and the light emitting device package can be improved.

A method for fabricating the light emitting device according to the embodiment includes forming a first conductive type semiconductor layer; forming an active layer of single layer or multi-layered structure including a well layer and a barrier layer on the first conductive type semiconductor layer; and forming a second conductive type semiconductor layer on the active layer.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a first semiconductor layer;
   an active layer including a plurality of well layers and a plurality of barrier layers on the first semiconductor layer;
   a second semiconductor layer on the active layer; and
   an electrode layer disposed on the second semiconductor layer and electrically connected to the second semiconductor layer,
   wherein the plurality of barrier layers include a first barrier layer disposed more closely to the second semiconductor layer than to the first semiconductor layer, a second barrier layer under a bottom surface of the first barrier layer, and a third barrier layer between the second barrier layer and the first semiconductor layer,
   wherein the plurality of well layers include a first well layer between the first and second barrier layers and a second well layer under a bottom surface of the second barrier layer,
   wherein the first barrier layer is an outermost layer of the active layer,
   wherein a top surface of the first barrier layer includes an uneven surface, and the first barrier layer has a flat bottom surface,
   wherein the uneven surface of the first barrier layer includes a convex part having a peak,
   wherein the second barrier layer has a flat top surface and a flat bottom surface,
   wherein a thickness of the first barrier layer is a maximum distance, in a vertical direction perpendicular to the flat bottom surface of the first barrier layer, between the peak of the convex part of the top surface of the first barrier layer and the flat bottom surface of the first barrier layer, and a thickness of the second barrier layer is a distance between the flat top surface of the second barrier layer and the flat bottom surface of the second barrier layer,
   wherein the thickness of the first barrier layer is greater than the thickness of the second barrier layer, and
   wherein the maximum distance is a distance between the peak of the convex part and the flat bottom surface of the first barrier layer overlapped with the peak of the convex part in the vertical direction perpendicular to the flat bottom surface of the first barrier layer.

2. The light emitting device according to claim 1, wherein the thickness of the first barrier layer is greater than a depth of a concave part of the uneven surface.

3. The light emitting device according to claim 2, wherein a pair of well layer/barrier layer of the active layer is formed with a period of 2 to 30.

4. The light emitting device according to claim 1, wherein the first semiconductor layer includes N-type dopant and the second semiconductor layer includes P-type dopant, and
   wherein a bottom surface of the active layer, which corresponds to the peak of the convex part, includes a flat surface.

5. The light emitting device according to claim 4, wherein a concentration of the N-type dopant included in the first semiconductor layer is higher than that of the P-type dopant included in the second semiconductor layer.

6. The light emitting device according to claim 1, wherein the convex part of the uneven surface of the first barrier layer includes a plurality of convex parts, and
   wherein the uneven surface of the first barrier layer includes a plurality of concave parts.

7. The light emitting device according to claim 6, wherein at least one of the plurality of concave parts has a flat section.

8. The light emitting device according to claim 6, wherein the concave part of the uneven surface of the first barrier layer includes an uneven pattern having a lower height than a peak height of the uneven surface.

9. The light emitting device according to claim 1, wherein an area of the uneven surface of the first barrier layer is larger than an area of the flat top surface of the second barrier layer by more than about 50%.

10. The light emitting device according to claim 1, further comprising a substrate under the first semiconductor layer,
    wherein the first semiconductor layer is disposed between a bottom surface of the active layer and a top surface of the substrate.

* * * * *